US009199805B2

(12) United States Patent
Furuya et al.

(10) Patent No.: US 9,199,805 B2
(45) Date of Patent: Dec. 1, 2015

(54) PROCESSING SYSTEM AND PROCESSING METHOD

(75) Inventors: Masaaki Furuya, Kanagawa-ken (JP);
Toyoyasu Tauchi, Kanagawa-ken (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 159 days.

(21) Appl. No.: 13/570,440

(22) Filed: Aug. 9, 2012

(65) Prior Publication Data

US 2013/0209212 A1    Aug. 15, 2013

(30) Foreign Application Priority Data

Aug. 12, 2011  (JP) .................................. 2011-177245
Jun. 15, 2012  (JP) .................................. 2012-135543

(51) Int. Cl.
*B65G 57/00*    (2006.01)
*H01L 21/677*   (2006.01)

(52) U.S. Cl.
CPC .......... *B65G 57/00* (2013.01); *H01L 21/67742* (2013.01); *H01L 21/67781* (2013.01)

(58) Field of Classification Search
USPC ............ 414/331.14, 331.18, 935, 221, 744.3, 414/744.7, 805, 806, 939, 941
See application file for complete search history.

(56) References Cited

U.S. PATENT DOCUMENTS

| 5,571,325 A * | 11/1996 | Ueyama et al. ............... 118/320 |
| 5,972,110 A * | 10/1999 | Akimoto ......................... 118/52 |
| 6,053,686 A * | 4/2000 | Kyogoku ...................... 414/217 |
| 6,059,507 A * | 5/2000 | Adams ........................... 414/217 |
| 6,444,974 B1 * | 9/2002 | Kojima ....................... 250/222.1 |
| 7,191,033 B2 * | 3/2007 | Higashi et al. ................ 700/213 |
| 8,444,363 B2 * | 5/2013 | Sakata et al. ................... 414/217 |
| 2002/0172580 A1 * | 11/2002 | Mueller et al. ........... 414/331.14 |
| 2003/0002964 A1 * | 1/2003 | Hee et al. .................. 414/331.18 |
| 2009/0053020 A1 * | 2/2009 | Okuno ...................... 414/222.01 |
| 2010/0150687 A1 | 6/2010 | Sakata et al. |
| 2010/0290886 A1 * | 11/2010 | Hashimoto et al. ........... 414/800 |

FOREIGN PATENT DOCUMENTS

| JP | 5-326666 | 12/1993 |
| JP | 9-74126 | 3/1997 |
| JP | 10-84029 A | 3/1998 |

OTHER PUBLICATIONS

Office Action issued May 26, 2014 in the Taiwanese Patent Application No. 101129116 (with English translation ).
Combined Chinese Office Action and Search Report issued Sep. 4, 2014 in Patent Application No. 201210286785.4 with English Translation and English Translation of Category of Cited Documents).

* cited by examiner

*Primary Examiner* — Kaitlin Joerger
(74) *Attorney, Agent, or Firm* — Oblon, McClelland, Maier & Neustadt, L.L.P.

(57) ABSTRACT

According to one embodiment, a processing system includes a storage section, a processing section, a mounting section, a first transport section, and a second transport section. The mounting section includes a plurality of holding sections with a first spacing in a stacking direction. The first transport section is configured to transport the workpiece between the storage section and the mounting section and to enter the mounting section at a first position in the stacking direction. The second transport section is configured to transport the workpiece between the processing section and the mounting section and to enter the mounting section at a second position different from the first position in the stacking direction. The first position is provided at two sites in the stacking direction across the second position. The first transport section and the second transport section are enabled to enter the mounting section around a same time.

8 Claims, 7 Drawing Sheets

PROCESSING SYSTEM AND PROCESSING METHOD

CROSS-REFERENCE TO RELATED APPLICATIONS

This application is based upon and claims the benefit of priority from the prior Japanese Patent Application No. 2011-177245, filed on Aug. 12, 2011, No. 2012-135543, filed on Jun. 15, 2012; the entire contents of which are incorporated herein by reference.

FIELD

Embodiments described herein relate generally to a processing system and a processing method.

BACKGROUND

In the manufacturing of semiconductor devices, flat panel displays and the like, there is known a processing system including a plurality of single wafer processing sections for processing a workpiece (such as wafer and glass substrate) one by one. There is also known a processing system including a mounting section (buffer section) provided between a storage section for storing workpieces and a plurality of processing sections, a first transport section for transporting a workpiece between the storage section and the mounting section, and a second transport section for transporting a workpiece between the plurality of processing sections and the mounting section (see, e.g., Patent Document 1).

In order to reduce the waiting time of the first transport section and the second transport section, there is proposed a processing system in which the first transport section and the second transport section can independently perform a receiving operation or a passing operation on the mounting section (see, e.g., Patent Document 2).

The processing system described in Patent Document 2 includes one region for storing predetermined unprocessed substrates, and one region for storing processed substrates. In each region, the holding section is used sequentially from the bottom to receive or pass a workpiece.

Thus, a waiting time occurs in one of the first transport section and the second transport section.

DETAILED DESCRIPTION

Figure 1:
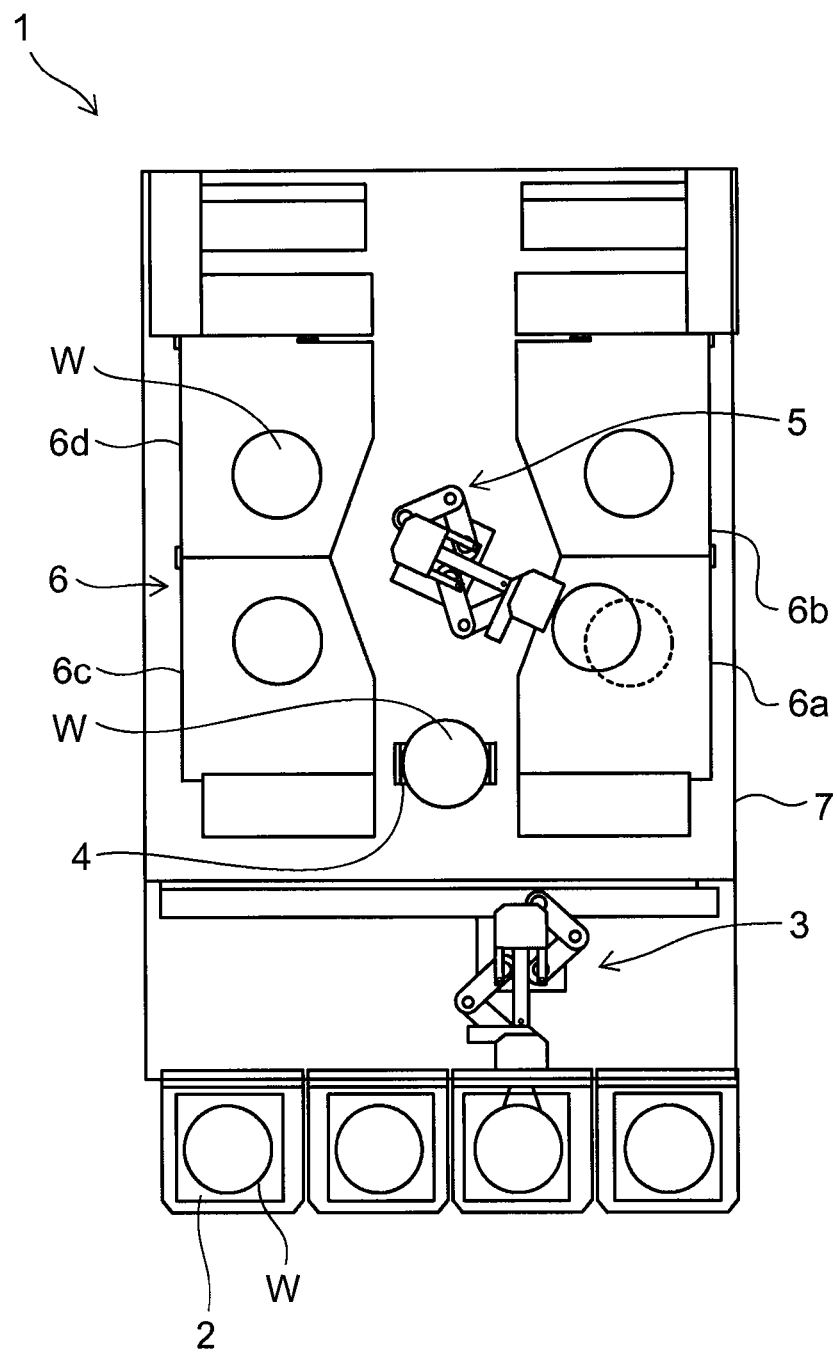
FIG. 1 is a schematic view for illustrating a processing system 1 according to a first embodiment.

In general, according to one embodiment, a processing system includes a storage section, a processing section, a mounting section, a first transport section, and a second transport section.

The storage section is configured to store a workpiece.

The processing section is configured to perform processing on the workpiece.

The mounting section includes a plurality of holding sections with a first spacing in a stacking direction. The holding section is configured to mount the workpiece.

The first transport section is configured to transport the workpiece between the storage section and the mounting section and to enter the mounting section at a first position in the stacking direction.

The second transport section is configured to transport the workpiece between the processing section and the mounting section and to enter the mounting section at a second position different from the first position in the stacking direction.

The first position is provided at two sites in the stacking direction across the second position.

The first transport section and the second transport section are enabled to enter the mounting section around a same time.

Embodiments will now be illustrated with reference to the drawings.

In the drawings, similar components are labeled with like reference numerals, and the detailed description thereof is omitted appropriately.

In the following, as an example, a processing system including a plurality of single wafer processing sections for processing a wafer W (silicon substrate) being a workpiece one by one is illustrated.

First Embodiment

FIG. 1 is a schematic view for illustrating a processing system 1 according to a first embodiment.

Figure 2:
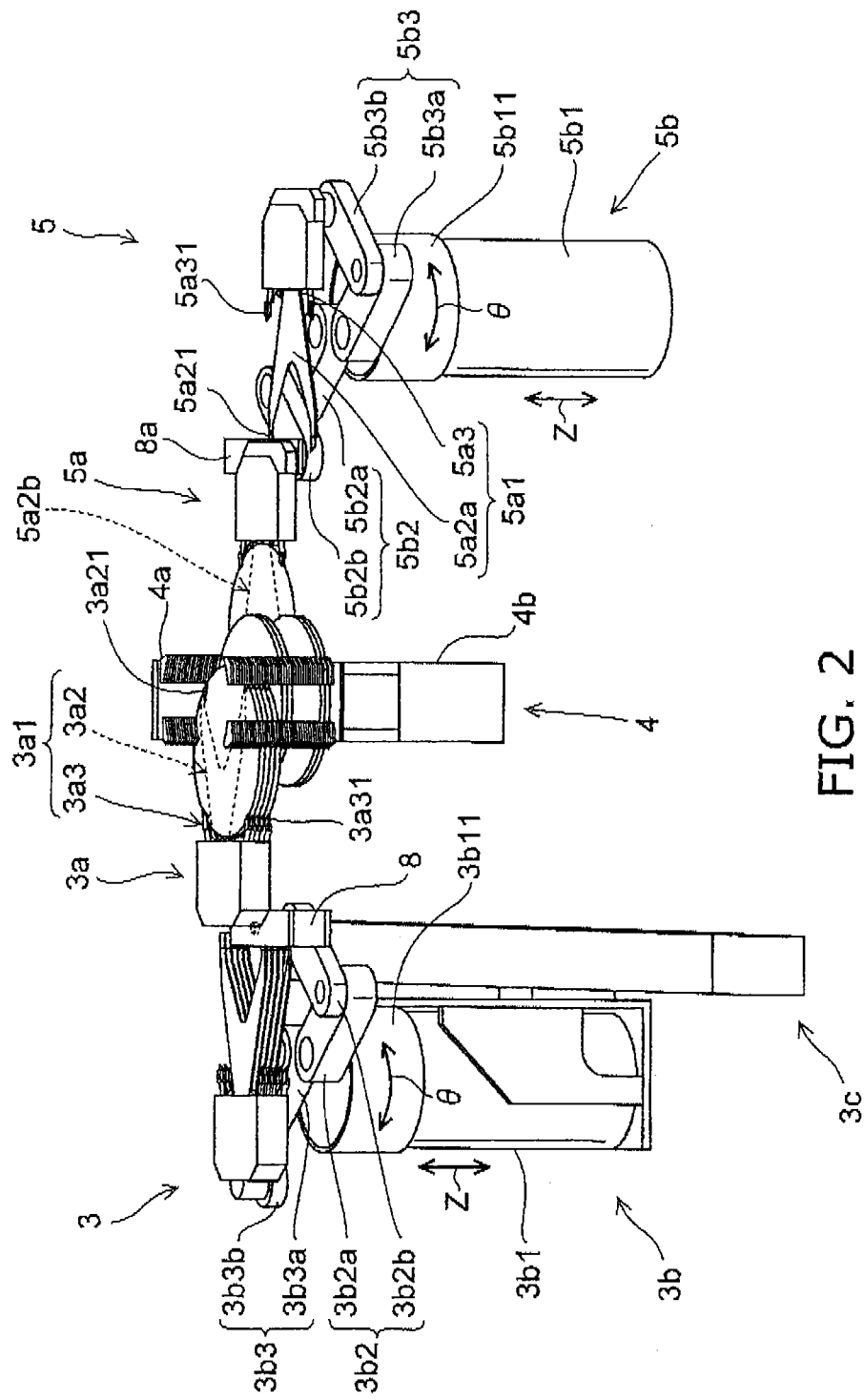
FIG. 2 is a schematic perspective view for illustrating a first transport section 3, a mounting section 4, and a second transport section 5.

FIG. 2 is a schematic perspective view for illustrating a first transport section 3, a mounting section 4, and a second transport section 5.

As shown in FIG. 1, the processing system 1 includes a storage section 2, a first transport section 3, a mounting section 4, a second transport section 5, and a processing section 6.

The storage section 2 stores unprocessed wafers W1 and processed wafers W2. In the following, the unprocessed wafers W1 and the processed wafers W2 are also collectively and simply referred to as wafers W.

The storage section 2 can be e.g. a wafer carrier capable of storing wafers W in a stacked (multistage) manner. In this case, the storage section 2 can be e.g. a FOUP (front-opening unified pod). The FOUP is a front-opening carrier intended to transport and store wafers W used in minienvironment semiconductor plants. In the case where a gate is provided on the front side (the side of loading/unloading wafers W) of the storage section 2, an opening/closing device, not shown, for opening/closing the gate can be provided.

In this example, four storage sections 2 are provided. However, the number and the installation position of the storage sections 2 are not limited to those illustrated, but can be appropriately modified.

The first transport section 3 transport wafers W between the storage section 2 and the mounting section 4.

As shown in FIG. 2, the first transport section 3 includes a holding device 3a, a horizontal multi-joint robot 3b, and a moving section 3c.

The holding device 3a includes a grasping section 3a1.

The grasping section 3a1 includes a grasping plate 3a2 and a grasping plate 3a3 for grasping a wafer W.

The grasping plate 3a2 is provided so as to extend out. At two positions of the tip portion, the grasping plate 3a2 includes grasping bodies 3a21 to be brought into contact with the periphery of the wafer W. The grasping plate 3a2 is configured so that the wafer W can be mounted on the upper surface of the grasping plate 3a2.

At two positions of the tip portion of the grasping plate 3a3, the grasping plate 3a3 includes grasping bodies 3a31 to be brought into contact with the periphery of the wafer W. The grasping bodies 3a21 and the grasping bodies 3a31 can be provided at positions symmetric with respect to the center of the wafer W.

The grasping body 3a21 and the grasping body 3a31 can be shaped like a circular cylinder. The shape dimension of the grasping body 3a21 and the shape dimension of the grasping body 3a31 can be made equal.

The grasping plate 3a2 and the grasping plate 3a3 can be moved by a driving section, not shown. The grasping plate 3a2 and the grasping plate 3a3 are configured to be able to grasp the wafer W by bringing the grasping bodies 3a21 and the grasping bodies 3a31 into contact with the periphery of the wafer W.

Five grasping sections 3a1 are provided in a stacked manner. The spacing between the grasping sections 3a1 in the stacking direction (e.g., Z direction in FIG. 2) is equal to the spacing (corresponding to an example of the first spacing) of holding sections 4a provided in the mounting section 4. The spacing of the holding sections 4a provided in the mounting section 4 is equal to the spacing of holding sections provided in the storage section 2. Thus, a plurality of wafers W (e.g., five wafers W) grasped by the grasping sections 3a1 in the stacking direction can be simultaneously passed to the storage section 2 or the mounting section 4, and can be simultaneously received from the storage section 2 or the mounting section 4.

Here, the number of grasping sections 3a1 provided in the stacking direction is preferably larger by one than the number of processing sections 6 (in the case illustrated in FIG. 1, the number of grasping sections 3a1 is five). Then, to the place of the mounting section 4 where the wafer W was mounted as an unprocessed wafer W, the same processed wafer W can be returned. That is, the processed wafer W can be returned to the same place of the mounting section 4. Furthermore, with respect to the mounting section 4, passing of unprocessed wafers W and receiving of processed wafers W can be performed in units of "the number of processing sections 6+1" wafers.

That is, the first transport section 3 can be configured to transport one more wafers W than the number of processing sections 6.

The number of grasping sections 3a1 provided in the stacking direction (the number of wafers W that can be transported at a time by the first transport section 3) is preferably equal to a divisor of the storage number in the storage section 2. That is, a number of the workpieces transported at a time by the first transport section 3 is a divisor of a maximum number of the workpieces stored in the storage section 2. Then, no extra number occurs at the time of transport. Thus, transport control can be simplified.

For instance, the storage section 2 may be a FOUP. Typically, the storage number of a FOUP is 25. Thus, in this case, the number of grasping sections 3a1 provided in the stacking direction can be set to 5.

Furthermore, if the number of grasping sections 3a1 provided in the stacking direction is set to 5, the number of processing sections 6 is 4. Thus, to the place of the mounting section 4 where the wafer W was mounted as an unprocessed wafer W, the same processed wafer W can be returned. Furthermore, with respect to the mounting section 4, passing of unprocessed wafers W and receiving of processed wafers W can be performed in units of five wafers.

That is, in the case illustrated in FIG. 1, it is the most efficient to set the number of grasping sections 3a1 provided in the stacking direction to 5.

In the case illustrated in FIG. 1, five grasping sections 3a1 are provided on each of the arm 3b2 and the arm 3b3. However, one grasping section 3a1 can also be provided on one of the arm 3b2 and the arm 3b3. In this case, the one grasping section 3a1 can be used for e.g. inspection in quality control and the like, and process assessment and the like with a small number of processed wafers.

In the case illustrated above, four grasping bodies (two grasping bodies 3a21 and two grasping bodies 3a31) are brought into contact with the periphery of the wafer W. Here, the number of grasping bodies only needs to be two or more. However, wafers W can be stably grasped by using three or more grasping bodies.

The rest of the configuration of the holding device 3a can be based on known techniques, and hence the detailed description thereof is omitted.

The horizontal multi-joint robot 3b includes a support section 3b1, an arm 3b2, and an arm 3b3.

The arm 3b2 and the arm 3b3 are provided on the upper surface of a movable section 3b11 provided at the upper end of the support section 3b1.

The arm 3b2 includes an arm 3b2a provided on the upper surface of the movable section 3b11, and an arm 3b2b provided via a rotary shaft on the arm 3b2a.

The arm 3b3 includes an arm 3b3a provided on the upper surface of the movable section 3b11, and an arm 3b3b provided via a rotary shaft on the arm 3b3a.

The support section 3b1 includes a vertical driving section, not shown, for vertically moving the movable section 3b11 in the direction of arrow Z, and a rotary driving section, not shown, for rotating the movable section 3b11 in the direction of arrow θ.

By the vertical driving section, not shown, the position of the holding device 3a provided above the movable section 3b11 is moved. Thus, wafers W can be passed to an arbitrary position in the storage section 2 and the mounting section 4, and can be received from an arbitrary position in the storage section 2 and the mounting section 4.

In this case, the vertical driving section is controlled by a controller, not shown, to perform vertical motion in the first transport section 3.

In the following, in the case where the position in the stacking direction of the holding device 3a is moved by the vertical driving section, the vertical driving section is controlled by a controller, not shown, to perform vertical motion in the first transport section 3 (movement of the position in the stacking direction of the holding device 3a).

The support section 3b1 further includes an extendable driving section, not shown, for extending and contracting the arm 3b2a and the arm 3b2b, and an extendable driving section, not shown, for extending and contracting the arm 3b3a and the arm 3b3b.

The holding device 3a is provided at each of the tip portion of the arm 3b2b and the tip portion of the arm 3b3b.

The arm 3b2b and the holding device 3a are connected by a member 8 having a cross-sectional shape of the letter "⊃". Thus, a space is formed between the arm 3b2b and the holding device 3a. This space has length and breadth dimensions such that five holding devices 3a provided on the arm 3b3b can pass therethrough when the arm 3b3 is extended and contracted.

The rest of the configuration of the horizontal multi-joint robot 3b can be based on known techniques, and hence the detailed description thereof is omitted.

In this example, the horizontal multi-joint robot 3b is illustrated. However, the embodiment is not limited thereto. It is possible to appropriately select a device capable of moving the holding device 3a toward and away from the storage section 2 or the mounting section 4. For instance, the device can be configured to linearly move the holding device 3a toward and away from the storage section 2 or the mounting section 4.

The moving section 3c is provided so that wafers W can be passed to and received from a plurality of storage sections 2 by the holding device 3a and the horizontal multi-joint robot 3b. That is, the moving section 3c is provided to move and position the horizontal multi-joint robot 3b in front of a prescribed storage section 2. The moving section 3c can be e.g. what is called a single axis robot.

The moving section 3c is not necessarily needed, but can be appropriately provided depending on the number and layout of the storage sections 2.

Here, the position (corresponding to an example of the first position) in the stacking direction of the first transport section 3 entering the mounting section 4 and the position (corresponding to an example of the second position) in the stacking direction of the second transport section 5 entering the mounting section 4 are made different.

Figure 5:
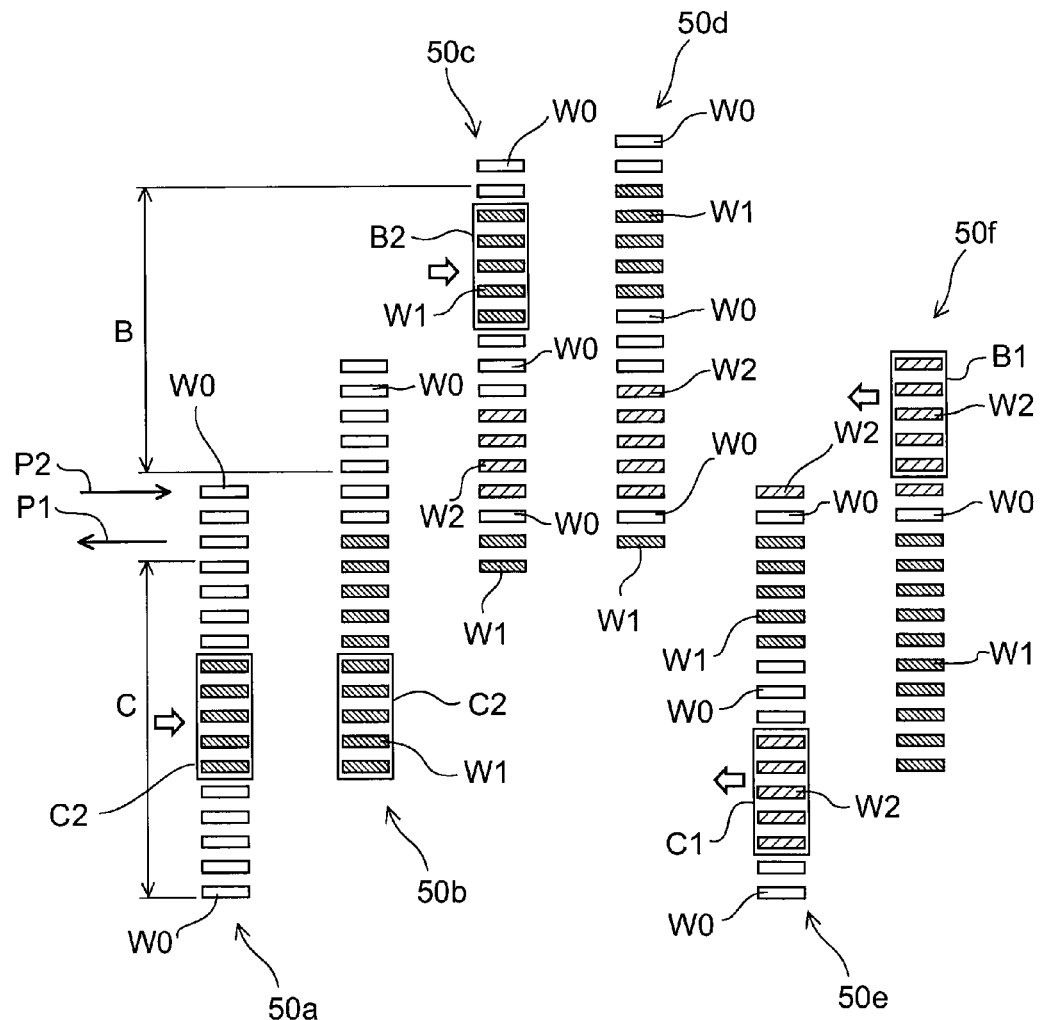
FIG. 5 is a schematic view for illustrating the position of the first transport section 3 performing the receiving operation and the passing operation (the position of entering the mounting section 4), and the position of the second transport section 5 performing the receiving operation and the passing operation (the position of entering the mounting section 4).

Furthermore, as shown in FIG. 5 described later, positions in the stacking direction of the first transport section 3 entering the mounting section 4 are provided at two sites in the stacking direction across the position in the stacking direction of the second transport section 5 entering the mounting section 4.

Furthermore, because the position in the stacking direction of the first transport section 3 entering the mounting section 4 and the position in the stacking direction of the second transport section 5 entering the mounting section 4 are made different, the first transport section 3 and the second transport section 5 can enter the mounting section 4 around the same time.

In this case, the position in the stacking direction of the first transport section 3 entering the mounting section 4 and the position in the stacking direction of the second transport section 5 entering the mounting section 4 are defined not with reference to the holding position of wafers W in the mounting section 4, but with reference to a position outside the mounting section 4. For instance, the positions are defined with reference to e.g. the attachment surface of the mounting section 4 on the housing 7.

Thus, even if the position in the stacking direction of the first transport section 3 and the second transport section 5 remains a prescribed position, the mounting section 4 may move vertically, and the holding position of wafers W may change. In this case, the entering position of the first transport section 3 and the second transport section 5 changes with respect to the prescribed holding position in the mounting section 4.

The details on the foregoing will be described later.

The mounting section 4 is provided between the storage section 2 and the processing section 6.

In FIG. 2, to avoid complexity, a partial cross section of the mounting section 4 is shown.

The mounting section 4 includes holding sections 4a for mounting wafers W in a stacked (multistage) manner with a prescribed spacing. As described above, the spacing of the holding sections 4a provided in the mounting section 4 is equal to the spacing of the holding sections provided in the storage section 2. The mounting section 4 thus provided allows wafers W to be temporarily mounted thereon. This can absorb the difference between the operation time on the storage section 2 side and the operation time on the processing section 6 side. Thus, the time efficiency of processing in the processing system 1 can be improved.

The mounting section 4 further includes a moving section 4b for changing the position of the holding sections 4a in the stacking direction of the holding sections 4a. Furthermore, a controller, not shown, for controlling the moving section 4b is provided. Thus, the moving section 4b is controlled by the controller, not shown, to perform vertical motion in the mounting section 4 (change of the position in the stacking direction of the holding sections 4a).

That is, the mounting section 4 includes a moving section 4b for moving wafers W mounted on the holding sections 4a in the stacking direction. The moving section 4b is configured to be able to move unprocessed wafers W2 depending on the position in the stacking direction of the second transport section 5 entering the mounting section 4. In this case, the position in the stacking direction of the second transport section 5 entering the mounting section 4 is set to a predetermined position. The details on the foregoing will be described later.

The second transport section 5 transports a wafer W between the processing section 6 and the mounting section 4.

The second transport section 5 includes a holding device 5a and a horizontal multi-joint robot 5b.

The configuration of the holding device 5a can be made similar to the configuration of the holding device 3a described above. For instance, the grasping plate 5a2, the grasping plate 5a3, the grasping body 5a21, the grasping body 5a31 and the like provided in the grasping section 5a1 can be made identical to the grasping plate 3a2, the grasping plate 3a3, the grasping body 3a21, the grasping body 3a31 and the like described above, respectively.

In the case of the grasping section 3a1, five grasping sections 3a1 are stacked in the stacking direction. However, in the case of the grasping section 5a1, the arm 5b2b and the arm 5b3b are each provided with one grasping section 5a1.

The configuration of the horizontal multi-joint robot 5b can be made similar to the configuration of the horizontal multi-joint robot 3b described above. For instance, the support section 5b1, the arm 5b2 (corresponding to an example of the first arm), the arm 5b3 (corresponding to an example of the second arm), the movable section 5b11, the arm 5b2a, the arm 5b2b, the arm 5b3a, the arm 5b3b, the member 8a and the like provided in the horizontal multi-joint robot 5b can be made identical to the support section 3b1, the arm 3b2, the arm 3b3, the movable section 3b11, the arm 3b2a, the arm 3b2b, the arm 3b3a, the arm 3b3b, the member 8 and the like described above, respectively.

That is, the second transport section 5 includes an arm 5b2 and an arm 5b3 spaced from the arm 5b2 by a prescribed spacing (corresponding to an example of the second spacing) in the stacking direction.

The configuration for vertical motion in the second transport section 5 can also be made similar to the configuration in the first transport section 3 described above.

That is, as in the case of the first transport section 3, the vertical driving section is controlled by a controller, not shown, to perform vertical motion in the second transport section 5.

In the following, in the case where the position in the stacking direction of the holding device 5a is moved by the vertical driving section, the vertical driving section is controlled by a controller, not shown, to perform vertical motion in the second transport section 5 (movement of the position in the stacking direction of the holding device 5a).

By providing a member 8a having a cross-sectional shape of the letter "⊐", a space is formed between the arm 5b2b and the holding device 5a. This space has length and breadth dimensions such that one holding device 5a provided on the arm 5b3b can pass therethrough when the arm 5b3 is extended and contracted.

The vertical driving section, not shown, provided in the support section 5b1 is configured so that the position of the holding device 5a provided above the movable section 5b11 is vertically moved by a prescribed dimension in the direction of arrow Z. In this case, vertical motion by the vertical driving section, not shown, can be performed by a dimension required to pass and receive a wafer W on the mounting section 4 and to pass and receive a wafer W on each of the processing sections 6a-6d described later.

The spacing in the stacking direction of the two holding devices 5a provided on the arm 5b2a and the arm 5b2b (the spacing between the upper grasping plate 5a2a and the lower grasping plate 5a2b) is set to an integer multiple of the pitch spacing of the holding sections 4a provided in the mounting section 4. The spacing in the stacking direction of the two holding devices 5a is thus configured. The processed wafer W grasped by one holding device 5a is mounted on the holding section 4a provided in the mounting section 4, and the holding device 5a is moved backward. At this time, the position in the stacking direction of the other holding device 5a can be aligned with the position of forward motion for receiving an unprocessed wafer W. Thus, the extending/contracting motion of the arm 5b2 and the arm 5b3 can be performed simultaneously. This can reduce the operation time required to pass and receive the wafer W.

In this example, the horizontal multi-joint robot 5b is illustrated. However, the embodiment is not limited thereto. It is possible to appropriately select a device capable of moving the holding device 5a toward and away from the mounting section 4 or the processing section 6. For instance, the device can be configured to linearly move the holding device 5a toward and away from the mounting section 4 or the processing section 6.

The procedure of passing wafers W and the procedure of receiving wafers W by the first transport section 3 and the second transport section 5 in the mounting section 4 will be described later.

The processing section 6 performs various processings on an unprocessed wafer W.

The processing section 6 can be provided in a plurality.

In this case, processing sections 6a-6d for performing various processings on the wafer W can be appropriately selected. For instance, the processing sections 6a-6d can be various film formation apparatuses such as a sputtering apparatus and a CVD (chemical vapor deposition) apparatus, an oxidation apparatus, various doping apparatuses such as a thermal diffusion apparatus and an ion implantation apparatus, an annealing apparatus, various resist processing apparatuses such as a resist application apparatus and a resist removal apparatus, an exposure apparatus, various etching processing apparatuses such as a wet etching apparatus and a dry etching apparatus, various ashing processing apparatuses such as a wet ashing apparatus and a dry ashing apparatus, various cleaning apparatuses such as a wet cleaning apparatus and a dry cleaning apparatus, and a CMP (chemical mechanical polishing) apparatus. However, the processing sections 6a-6d are not limited thereto, but can be appropriately modified depending on the processing of the wafer W.

The processing sections 6a-6d may be processing apparatuses for performing the same processing, or may be processing apparatuses for performing different processings. For instance, the processing sections 6a-6d may all be etching processing apparatuses, or may be processing apparatuses concerning a series of processings such as film formation, resist processing, etching processing, and ashing processing. These various processing apparatuses can be based on known techniques, and hence the detailed description thereof is omitted.

Furthermore, the first transport section 3, the mounting section 4, the second transport section 5, and the processing section 6 can be housed inside a housing 7. The housing 7 is shaped like a box and includes an opening, not shown, so that the front of the storage section 2 can communicate with the inside of the housing 7. A filter and a blast fan, not shown, are provided on the ceiling portion of the housing 7. By the blast fan, outside air can be introduced into the housing 7 through the filter. By introducing outside air into the housing 7, the pressure inside the housing 7 can be increased. This can suppress entry of particles and the like into the housing 7. The housing 7 is not necessarily needed, but may be appropriately provided as needed.

Next, the action of the processing system 1 is illustrated.

Passing of wafers W and receiving of wafers W in the storage section 2, passing of wafers W and receiving of wafers W in the processing sections 6a-6d, and processing of wafers W in the processing sections 6a-6d can be based on known techniques, and hence the description thereof is omitted.

Thus, passing of wafers W and receiving of wafers W in the mounting section 4 are illustrated herein.

FIGS. 3A to 3D are schematic views for illustrating receiving of an unprocessed wafer W1 from the holding section 4a and passing of a processed wafer W2 to the holding section 4a by the second transport section 5.

As described later, during receiving of an unprocessed wafer W1 from the holding section 4a and passing of a processed wafer W2 to the holding section 4a by the second transport section 5, vertical motion of the holding section 4a by the moving section 4b is not performed.

The configuration concerning the mounting section 4 and the second transport section 5 is similar to that illustrated in FIGS. 1 and 2.

Figure 3A:
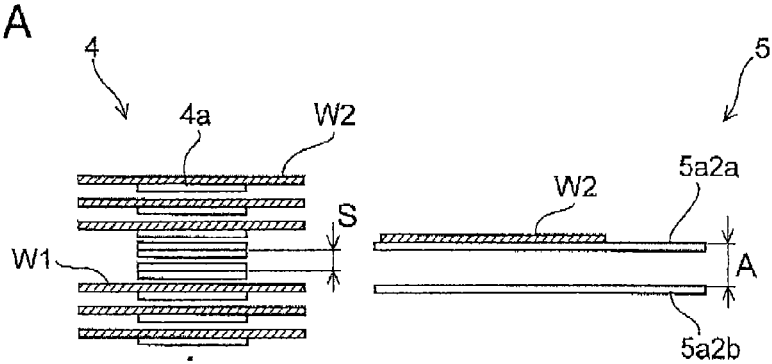
FIGS. 3A to 3D are schematic views for illustrating receiving of an unprocessed wafer W1 from the holding section 4a and passing of a processed wafer W2 to the holding section 4a by the second transport section 5.

As shown in FIG. 3A, by the vertical driving section, not shown, provided on the support section 5b1, the position in the stacking direction of the upper grasping plate 5a2a grasping the processed wafer W2 is positioned. Here, the lower surface position of the processed wafer W2 is positioned at a position slightly higher than the upper surface position of the holding section 4a being about to hold the wafer W of the mounting section 4.

Thus, the upper grasping plate 5a2a is positioned at a prescribed position above the holding section 4a. Then, when the wafer W2 is mounted on the holding section 4a, the impact occurring by contact between the wafer W2 and the holding section 4a can be reduced. This can suppress jumping and misalignment of the wafer W2 when the wafer W2 is mounted on the holding section 4a.

Figure 3B:
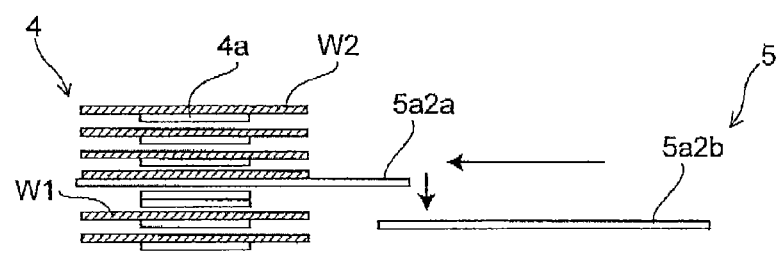

Next, as shown in FIG. 3B, the upper grasping plate 5a2a is moved toward the mounting section 4. The lower surface position of the wafer W2 inserted inside the mounting section 4 is positioned at a position slightly higher than the upper surface position of the holding section 4a. Then, grasping of the wafer W2 is disengaged. The upper grasping plate 5a2a is moved down by the vertical driving section, not shown, provided in the support section 5b1. Thus, the processed wafer W2 is mounted on the holding section 4a. At this time, the upper grasping plate 5a2a is directly moved down and positioned at a position between the holding section 4a mounting the processed wafer W2 and the adjacent holding section 4a therebelow.

Here, the upper grasping plate 5a2a and the lower grasping plate 5a2b are vertically moved at the same time by the vertical driving section, not shown, provided in the support section 5b1. In the vertical motion in this case, the upper grasping plate 5a2a and the lower grasping plate 5a2b are moved in the opposite direction. For instance, if the upper grasping plate 5a2a is moved up, the lower grasping plate 5a2b is moved down.

The spacing A between the upper grasping plate 5a2a and the lower grasping plate 5a2b is an integer multiple of (twice, in the case illustrated in FIGS. 3A to 3D) the pitch spacing S of the holding sections 4a provided in the mounting section 4. The spacing A between the upper grasping plate 5a2a and the lower grasping plate 5a2b is thus configured. The processed wafer W2 grasped by one holding device 5a is mounted on the holding section 4a provided in the mounting section 4, and the holding device 5a is moved backward. At this time, the position in the stacking direction of the other holding device 5a can be aligned with the position of forward motion for receiving an unprocessed wafer W1.

In this case, for instance, the upper grasping plate 5a2a mounts the processed wafer W2 on the holding section 4a. Then, the upper grasping plate 5a2a can finish moving down at a position such that a small gap occurs between the lower surface of the unprocessed wafer W1 mounted on the mounting section 4 and the lower grasping plate 5a2b.

The lower grasping plate 5a2b can be positioned at such a position. Then, when the wafer W1 is received from the holding section 4a, the impact occurring by contact between the wafer W1 and the lower grasping plate 5a2b can be reduced. This can suppress jumping and misalignment of the wafer W1 when the wafer W1 is received.

Furthermore, once the positioning operation in the stacking direction is performed, the extending/contracting motion of the arm 5b2 and the arm 5b3 can be performed at that position. This can reduce the operation time required to pass and receive wafers W1, W2. For instance, the operation time can be reduced by approximately 25% compared with the case where the arm 5b2 and the arm 5b3 are separately positioned in the stacking direction.

Here, the spacing A between the upper grasping plate 5a2a and the lower grasping plate 5a2b is not limited to twice the pitch spacing S of the holding sections 4a, but may be an integer multiple of the pitch spacing S of the holding sections 4a.

Figure 3C:
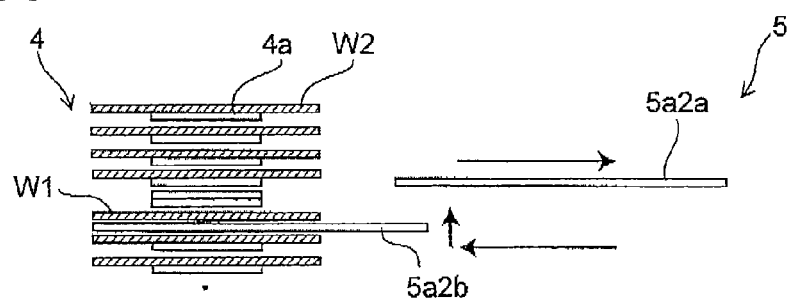

Next, as shown in FIG. 3C, the upper grasping plate 5a2a is moved away from the mounting section 4.

Furthermore, in order to receive an unprocessed wafer W1 from the mounting section 4, the lower grasping plate 5a2b is moved toward the mounting section 4.

The lower grasping plate 5a2b inserted inside the mounting section 4 is positioned below the unprocessed wafer W1. Then, the lower grasping plate 5a2b is moved up by the vertical driving section, not shown, provided in the support section 5b1. Thus, the unprocessed wafer W1 is mounted on the lower grasping plate 5a2b. At this time, the lower grasping plate 5a2b is directly moved up and positioned at a position between the holding section 4a where the received unprocessed wafer W1 was mounted, and the adjacent holding section 4a thereabove. The unprocessed wafer W1 mounted on the lower grasping plate 5a2b is grasped via the grasping body 5a21 and the grasping body 5a31, not shown.

Figure 3D:
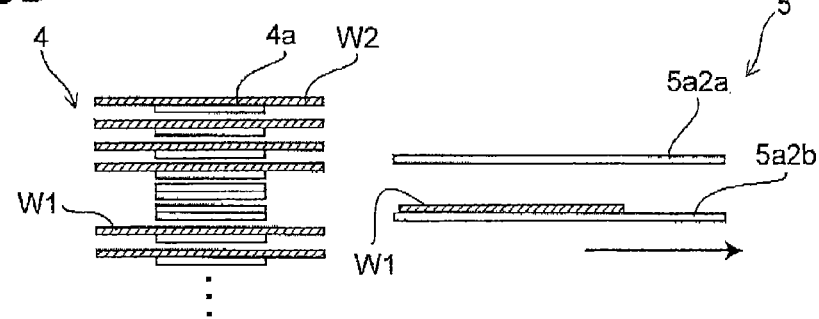

Next, as shown in FIG. 3D, the lower grasping plate 5a2b is moved away from the mounting section 4. Thus, passing and receiving of the processed wafer W2 and the unprocessed wafer W1 are performed. Passing and receiving of the processed wafer W2 and the unprocessed wafer W1 in each of the processing sections 6a-6d can also be performed by a similar operation.

Figure 4:
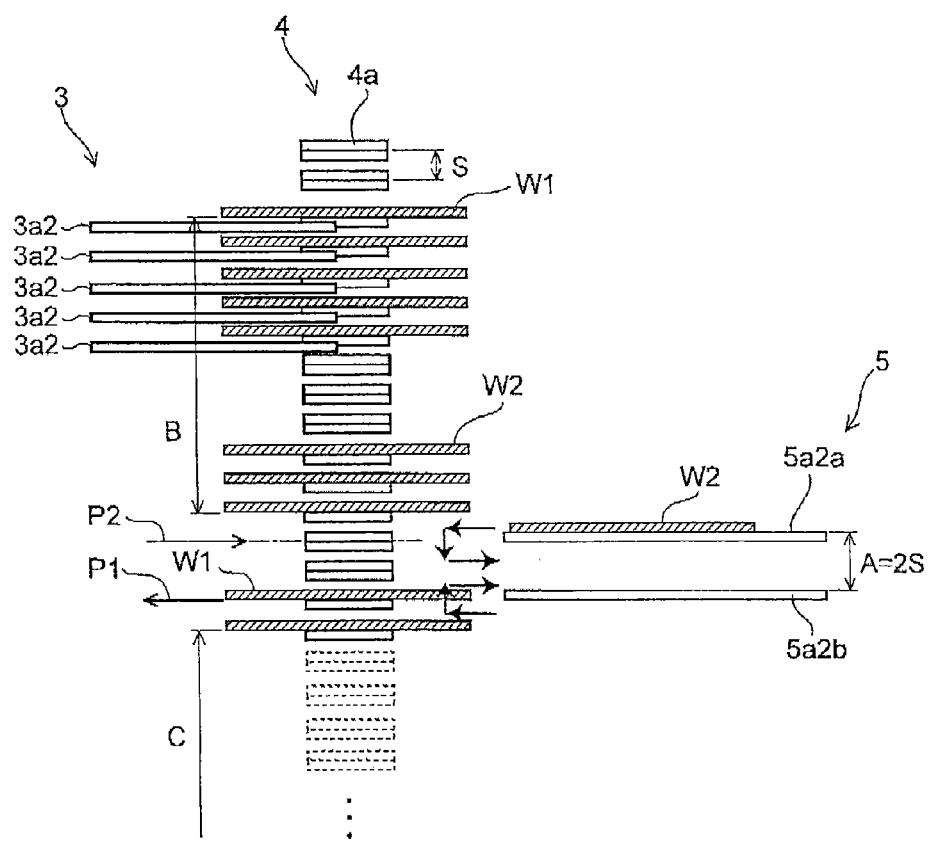
FIG. 4 is a schematic view for illustrating receiving of an unprocessed wafer W1 from the holding section 4a and passing of a processed wafer W2 to the holding section 4a by the first transport section 3 and the second transport section 5.

FIG. 4 is a schematic view for illustrating receiving of an unprocessed wafer W1 from the holding section 4a and passing of a processed wafer W2 to the holding section 4a by the first transport section 3 and the second transport section 5.

As shown in FIG. 4, receiving of an unprocessed wafer W1 from the holding section 4a by the second transport section 5 is performed at position P1. Passing of a processed wafer W2 to the holding section 4a by the second transport section 5 is performed at position P2. In this case, the spacing between the position P1 and the position P2 is A, i.e., 2S. After completion of passing of the processed wafer W2 and receiving of the unprocessed wafer W1, the position of the holding section 4a is moved up by the amount of the pitch spacing S of the holding sections 4a by the moving section 4b. In this case, the moving section 4b is controlled by a controller, not shown, to perform upward motion in the mounting section 4.

The moving up of the position of the holding section 4a can be performed upon each completion of the receiving operation and the passing operation of the second transport section 5. Alternatively, the moving up of the position of the holding section 4a can be performed by an integer multiple of the pitch spacing S after the receiving operation and the passing operation are repeated several times.

In this case, the holding section 4a is moved up or down when, after completion of the receiving operation and the passing operation, the first transport section 3 and the second transport section 5 have been retracted from the mounting section 4.

In the following, in the case where the position of the holding section 4a is changed by the moving section 4b, the moving section 4b is controlled by a controller, not shown, to perform vertical motion in the mounting section 4.

Thus, the second transport section 5 can perform the next receiving operation and passing operation at the position P1 and the position P2. That is, the second transport section 5 can perform the receiving operation and the passing operation always at the same position (position P1, position P2). In other words, the movement range in the stacking direction of the second transport section 5 with respect to the mounting section 4 can be restricted to a prescribed range.

Next, the operation of the first transport section 3 is illustrated. The holding section 4a is moved up e.g. by the amount of the pitch spacing S of the holding sections 4a upon each completion of the receiving operation and the passing operation of the second transport section 5. Thus, processed wafers W2 have been mounted on the holding sections 4a above the position P2. When the number of processed wafers W2 mounted on the holding sections 4a above the position P2 becomes equal to or larger than the number of grasping sections 3a1 provided in a stacked manner (becomes five or more in the case illustrated in FIG. 4), the processed wafers W2 are received from the mounting section 4 by the first transport section 3. That is, in the range B above the position P2, the operation of receiving processed wafers W2 by the first transport section 3 is performed.

The operations of receiving and passing wafers W in the first transport section 3 can be made similar to the operations of receiving and passing wafers W in the second transport section 5 illustrated in FIGS. 3A to 3D.

After the unprocessed wafer W1 mounted on the lowermost holding section 4a is received by the second transport section 5, the mounting section 4 is moved down so that the position of the uppermost holding section 4a is located at the position P2. In this case, in the range C below the position P1, the operation of receiving processed wafers W2 by the first transport section 3 is performed.

The range B and the range C are ranges where the first transport section 3 can enter the mounting section 4 without interfering with the second transport section 5 even if the second transport section 5 has entered the mounting section 4.

On the other hand, also in the case where unprocessed wafers W1 are passed to the holding section 4a by the first transport section 3, the operation of passing unprocessed wafers W1 by the first transport section 3 is performed in the range B or the range C.

Thus, with respect to the mounting section 4, the position of the first transport section 3 performing the receiving operation or the passing operation and the position of the second transport section 5 performing the receiving operation or the passing operation are different. Hence, the first transport section 3 and the second transport section 5 can enter the mounting section 4 around the same time (e.g., simultaneously). This can suppress the occurrence of waiting time in the first transport section 3 and the second transport section 5. Furthermore, the first transport section 3 and the second transport section 5 can be separately controlled without relation to each other.

FIG. 5 is a schematic view for illustrating the position of the first transport section 3 performing the receiving operation and the passing operation (the position of entering the mounting section 4), and the position of the second transport section 5 performing the receiving operation and the passing operation (the position of entering the mounting section 4).

Rectangles in FIG. 5 represent the holding sections 4a. W0 represents the case where no wafer is mounted thereon. W1 represents the case where an unprocessed wafer W1 is mounted thereon. W2 represents the case where a processed wafer W2 is mounted thereon. A set of rectangles arranged in one vertical column represents the holding sections 4a. The states 50a-50f depicted at different heights represent the states of being moved up and down by the transport section 5. For instance, the state 50e represents the state in which the holding sections 4a are moved to the lowest position, and the state 50f represents the state of being moved up again.

Receiving of an unprocessed wafer W1 from the holding section 4a by the second transport section 5 is performed at the position P1. Passing of a processed wafer W2 to the holding section 4a by the second transport section 5 is performed at the position P2.

As an example, it is assumed that receiving of a processed wafer W2 from the holding section 4a by the first transport section 3 is performed at position B1 and position C1. Furthermore, as an example, it is assumed that passing of an unprocessed wafer W1 to the holding section 4a by the first transport section 3 is performed at position B2 and position C2.

That is, positions in the stacking direction of the first transport section 3 entering the mounting section 4 (e.g., position B1, position C1, position B2, position C2) are provided at two sites in the stacking direction across the position in the stacking direction of the second transport section 5 entering the mounting section 4 (e.g., position P1, position P2).

Thus, as described later, the occurrence of waiting time in the first transport section 3 and the second transport section 5 can be significantly suppressed.

As shown in FIG. 5, in the case of the initial state 50a, passing of an unprocessed wafer W1 by the first transport section 3 can be performed at the position C2 located in the range C below the position P1.

In the case where any holding section 4a capable of mounting an unprocessed wafer W1 still remains in the range C, the position of the holding section 4a is moved up as shown in the state 50b. Then, passing of an unprocessed wafer W1 by the first transport section 3 can be further performed at the position C2.

As described above (see FIG. 4), upon each completion of passing of a processed wafer W2 and receiving of an unprocessed wafer W1 by the second transport section 5, the position of the holding section 4a is moved up by the amount of the pitch spacing S of the holding sections 4a by the moving section 4b.

Thus, as shown in the state 50c, in the case where any holding section 4a capable of mounting an unprocessed wafer W1 exists in the range B above the position P2, passing of an unprocessed wafer W1 by the first transport section 3 can be performed at the position B2.

In this case, the first transport section 3 can be configured not to pass an unprocessed wafer W1 to the holding section 4a located in the spacing of the arm of the second transport section 5.

For instance, in the case where passing of an unprocessed wafer W1 by the first transport section 3 is performed in the range B, the first transport section 3 can be configured not to pass an unprocessed wafer W1 to the uppermost holding section 4a and to the holding section 4a therebelow, because the spacing between P1 and P2 is 2S (two stages). Then, as shown in the state 50e, even immediately after the position of the uppermost holding section 4a is moved to the position P2, a processed wafer W2 can be passed to the uppermost holding section 4a by the second transport section 5. That is, the second transport section 5 being placed in the waiting state can be suppressed.

Furthermore, as shown in the state 50d, the unprocessed wafer W1 mounted on the lowermost holding section 4a is received by the second transport section 5. Then, as shown in the state 50e, the position of the uppermost holding section 4a is moved down to the position P2. Here, in the case where any processed wafer W2 that can be received by the first transport section 3 exists in the range C, receiving of the processed wafer W2 by the first transport section 3 can be performed at the position C1.

Furthermore, as shown in the state 50f, in the case where any processed wafer W2 that can be received by the first transport section 3 exists in the range B, receiving of the processed wafer W2 by the first transport section 3 can be performed in the range B.

Here, in any case of the states 50a-50f, the position P1 of receiving an unprocessed wafer W1 from the holding section 4a by one holding device 5a of the second transport section 5 is constant. The position P2 of passing a processed wafer W2 to the holding section 4a by the other holding device 5a of the second transport section 5 is constant.

In this example, receiving of a processed wafer W2 or passing of an unprocessed wafer W1 is performed by the first transport section 3 at the position B1, the position C1, the position B2, and the position C2. However, the position of receiving or passing is not limited thereto. The position of receiving or passing can be appropriately selected from positions located in the range B and the range C. For instance, positions located in the range B and the range C can be appropriately selected depending on e.g. the number of holding sections 4a, the number of wafers received or passed at a time by the first transport section 3, the processing time in each of the processing sections 6a-6d, the transport time by the first transport section 3, and the transport time by the second transport section 5.

According to this embodiment, with respect to the mounting section 4, the position of the first transport section 3 performing the receiving operation or the passing operation and the position of the second transport section 5 performing the receiving operation or the passing operation are different. Hence, the first transport section 3 and the second transport section 5 can enter the mounting section 4 around the same time. Furthermore, positions in the stacking direction of the first transport section 3 entering the mounting section 4 are provided at two sites in the stacking direction across the position in the stacking direction of the second transport section 5 entering the mounting section 4. This can suppress the occurrence of waiting time in the first transport section 3 and the second transport section 5. Thus, the productivity can be improved.

Furthermore, this can eliminate the need of complex control for preventing interference between the first transport section 3 and the second transport section 5. Thus, the first transport section 3 and the second transport section 5 can be separately controlled without relation to each other.

Second embodiment

Figure 6:
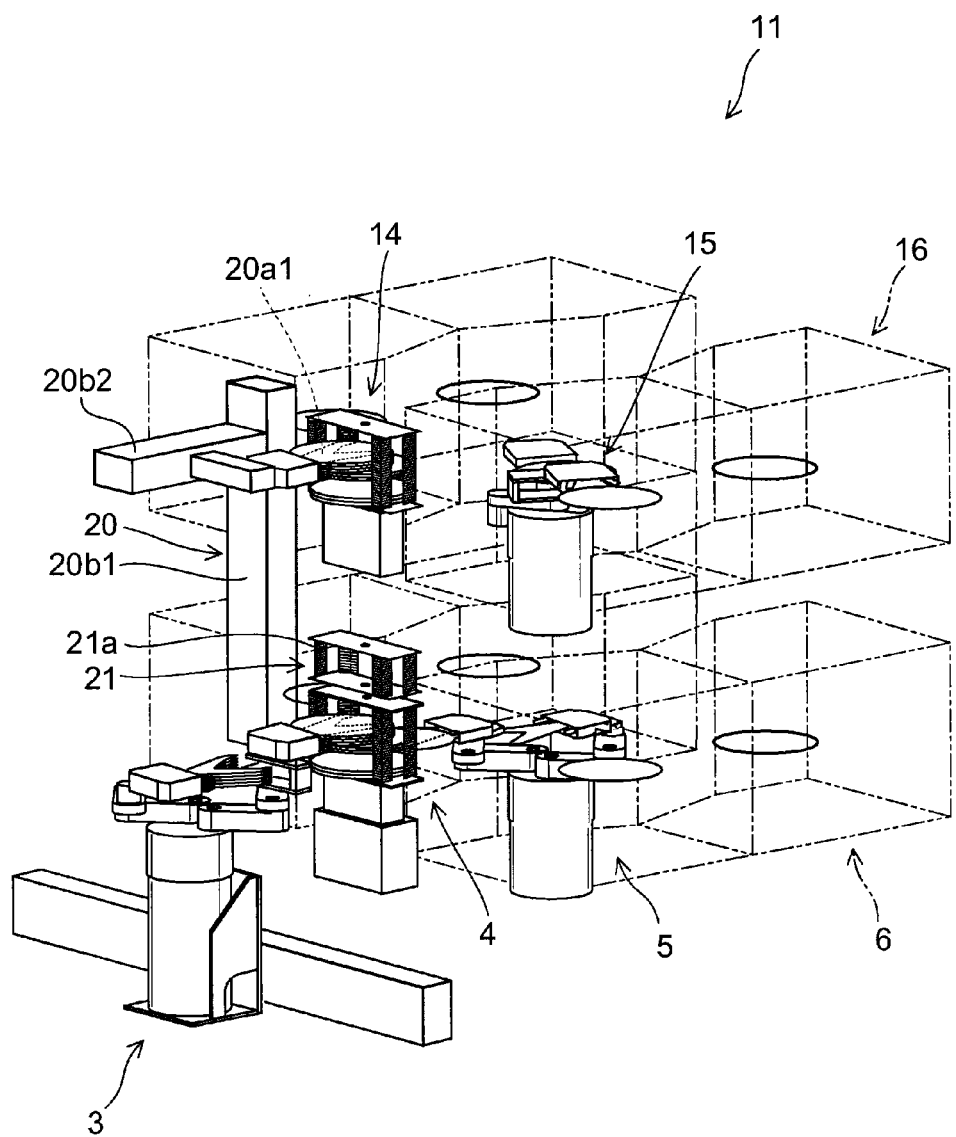
FIG. 6 is a schematic perspective view for illustrating a processing system 11 according to a second embodiment.

FIG. 6 is a schematic perspective view for illustrating a processing system 11 according to a second embodiment.

As shown in FIG. 6, like the processing system 1 described above, the processing system 11 includes a storage section, not shown, a first transport section 3, a mounting section 4, a second transport section 5, and a processing section 6. Above the mounting section 4, the second transport section 5, and the processing section 6, a mounting section 14, a fourth transport section 15, and a processing section 16 are provided. Furthermore, a third transport section 20 and a mounting section 21 are provided. That is, the processing system 11 includes two tiers, each including the mounting section 4, the second transport section 5, and the processing section 6 provided in the processing system 1.

In this case, the mounting section 14, the fourth transport section 15, and the processing section 16 can be made similar to the mounting section 4, the second transport section 5, and the processing section 6 described above.

The mounting section 21 can be configured, like the mounting section 4, to include holding sections 21a for mounting wafers W. The mounting section 21 can be configured to temporarily mount unprocessed wafers W1 and processed wafers W2.

The third transport section 20 can be configured to transport unprocessed wafers W1 and processed wafers W2 mounted on the mounting section 21 toward the mounting section 14, and to transport processed wafers W2 mounted on the mounting section 14 toward the mounting section 21.

In the third transport section 20, five grasping sections 20a1 like the grasping sections 3a1 provided in the first transport section 3 are stacked in the stacking direction. Furthermore, instead of the horizontal multi-joint robot 3b provided in the first transport section 3, single axis robots 20b1, 20b2 are provided.

Here, the third transport section 20 and the mounting section 21 are not necessarily needed. The first transport section 3 may be configured to transport unprocessed wafers W1 and processed wafers W2 toward the mounting section 14.

In this example, the processing sections and the like are provided in two tiers. However, the number of tiers is not limited to two. In this case, the processing system can be configured to include three or more tiers. The processing system including three or more tiers can be realized by lengthening the transport distance in the third transport section 20.

The processing in the lower tier and the processing in the upper tier can be made identical. Alternatively, wafers W2 processed in the lower tier can be further processed in the upper tier.

Also in this embodiment, with respect to the mounting section 4, the position of the first transport section 3 performing the receiving operation or the passing operation and the position of the second transport section 5 performing the receiving operation or the passing operation are made different. Furthermore, with respect to the mounting section 14, the position of the third transport section 20 performing the receiving operation or the passing operation and the position of the fourth transport section 15 performing the receiving operation or the passing operation are made different.

This can prevent interference between the first transport section 3 and the second transport section 5, and interference between the third transport section 20 and the fourth transport section 15. As a result, the first transport section 3 and the second transport section 5 and the third transport section 20 and the fourth transport section 15 can be separately controlled without relation to each other. This can suppress complication of control even in a complex processing system 11 including processing sections in two tiers. In this case, for instance, control of each transport section can be individually performed. This can suppress the increase of load on the control system even in the case of increase in the number of tiers and increase in the number of processing sections in each tier. Thus, the occurrence of problems such as delay in process timing can be suppressed.

Third embodiment

Next, a processing method according to a third embodiment is illustrated.

Figure 7:
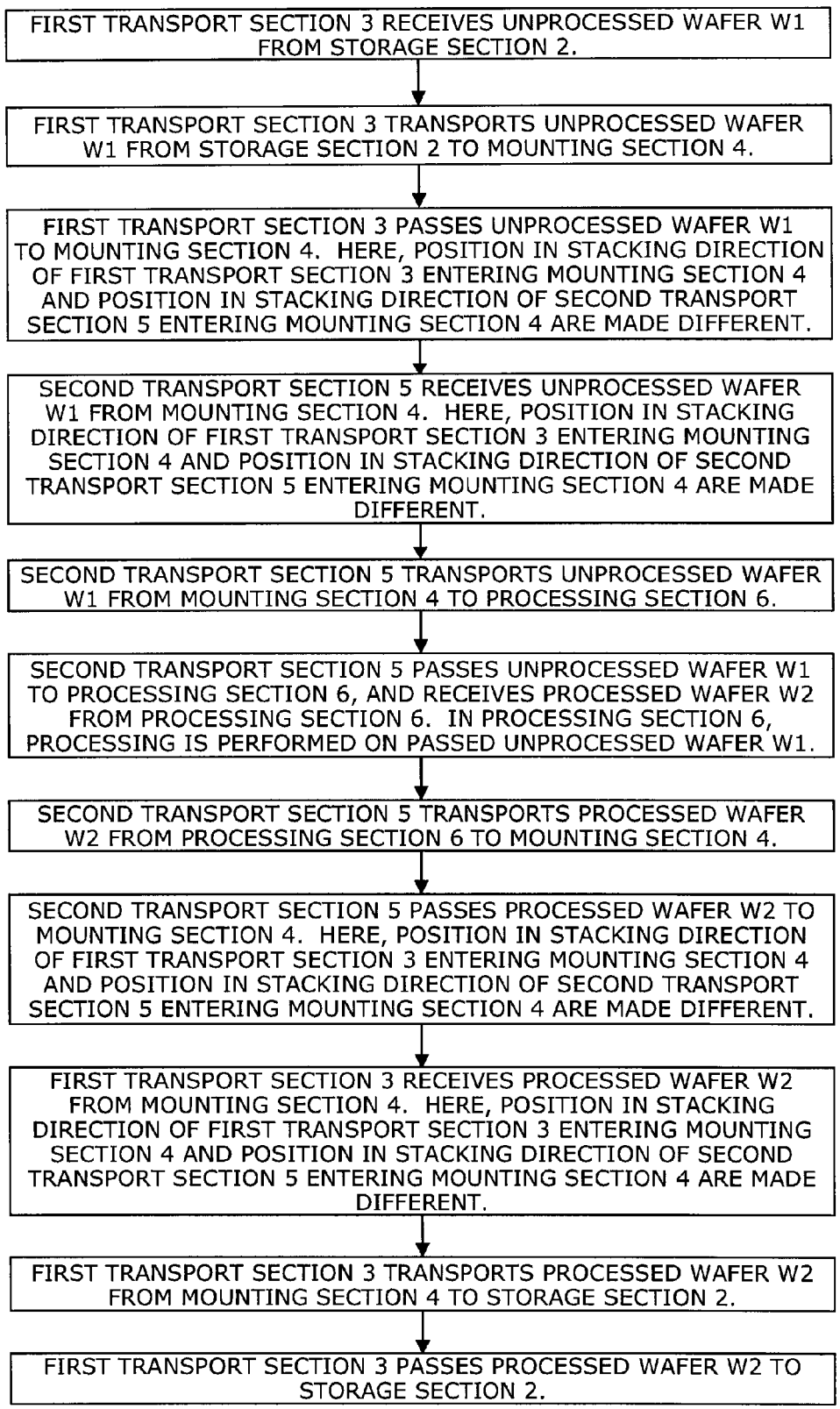
FIG. 7 is a flow chart for illustrating the processing method according to the third embodiment.

FIG. 7 is a flow chart for illustrating the processing method according to the third embodiment.

As shown in FIG. 7, the processing method according to the third embodiment can be performed using e.g. the processing system 1, 11 described above.

The processing method according to the third embodiment can be performed by e.g. the following procedure.

First, by the first transport section 3, an unprocessed wafer W1 is received from the storage section 2.

Next, by the first transport section 3, the unprocessed wafer W1 is transported from the storage section 2 to the mounting section 4.

Next, by the first transport section 3, the unprocessed wafer W1 is passed to the mounting section 4. Here, the position (corresponding to an example of the first position) in the stacking direction of the first transport section 3 entering the mounting section 4 and the position (corresponding to an example of the second position) in the stacking direction of the second transport section 5 entering the mounting section 4 are made different.

Next, by the second transport section 5, the unprocessed wafer W1 is received from the mounting section 4. Here, the position in the stacking direction of the first transport section 3 entering the mounting section 4 and the position in the stacking direction of the second transport section 5 entering the mounting section 4 are made different.

Next, by the second transport section 5, the unprocessed wafer W1 is transported from the mounting section 4 to the processing section 6.

Next, by the second transport section 5, the unprocessed wafer W1 is passed to the processing section 6, and a processed wafer W2 is received from the processing section 6. Furthermore, in the processing section 6, processing is performed on the passed unprocessed wafer W1.

Next, by the second transport section 5, the processed wafer W2 is transported from the processing section 6 to the mounting section 4.

Next, by the second transport section 5, the processed wafer W2 is passed to the mounting section 4. Here, the position in the stacking direction of the first transport section 3 entering the mounting section 4 and the position in the stacking direction of the second transport section 5 entering the mounting section 4 are made different.

Next, by the first transport section 3, the processed wafer W2 is received from the mounting section 4. Here, the position in the stacking direction of the first transport section 3 entering the mounting section 4 and the position in the stacking direction of the second transport section 5 entering the mounting section 4 are made different.

Next, by the first transport section 3, the processed wafer W2 is transported from the mounting section 4 to the storage section 2.

Next, by the first transport section 3, the processed wafer W2 is passed to the storage section 2.

Subsequently, the above procedure can be repeated to perform processing on unprocessed wafers W1.

That is, the processing method according to the third embodiment can include: causing a first transport section 3 to transport a wafer W between a storage section 2 storing wafers W being workpieces and a mounting section 4 mounting wafers W in a stacked manner with a prescribed spacing; causing a second transport section to transport the wafer W between a processing section 6 performing processing on the wafer W and the mounting section 4; and performing processing on an unprocessed wafer W1 in the processing section 6. The position in the stacking direction of the first transport section 3 entering the mounting section 4 and the position in the stacking direction of the second transport section 5 entering the mounting section 4 can be made different.

In this case, the position in the stacking direction of the first transport section 3 entering the mounting section 4 and the position in the stacking direction of the second transport section 5 entering the mounting section 4 are made different. Thus, the first transport section 3 and the second transport section 5 can enter the mounting section 4 around the same time.

Furthermore, the position in the stacking direction of the second transport section 5 entering the mounting section 4 can be set to a predetermined position. The method can further include moving the unprocessed wafer W1 mounted on the mounting section 4 depending on the position in the stacking direction of the second transport section 5 entering the mounting section 4.

Furthermore, the processing section 6 can be provided in a plurality. In the step of causing the first transport section 3 to transport a wafer W, the first transport section 3 can transport one more wafers W than the number of processing sections 6.

Furthermore, in the step of causing the first transport section 3 to transport a wafer W, the first transport section 3 can transport wafers W the number of which is a divisor of the storage number of the storage section 2.

Here, the elements in each step are similar to those illustrated in the action of the processing systems 1, 11 described above, and hence the detailed description thereof is omitted.

The embodiments have been illustrated above. However, the invention is not limited to the description thereof.

Those skilled in the art can appropriately modify the above embodiments by addition, deletion, or design change of components, or by addition, omission, or condition change of steps. Such modifications are also encompassed within the scope of the invention as long as they include the features of the invention.

For instance, the shape, dimension, material, layout, number and the like of the elements included in the processing system 1, 11 are not limited to those illustrated, but can be appropriately modified.

In the foregoing, as the workpiece processed in the processing system 1, 11, a wafer is illustrated. However, the workpiece is not limited thereto. The workpiece can be e.g. any workpiece that can be stored in a stacked manner such as glass substrates, printed substrates, ceramic substrates, optical storage media and other plate-like bodies, electronic parts, and electric parts. The processing performed in the processing section 6 is also not limited to those described above, but can be appropriately modified depending on the workpiece.

In the foregoing, as the holding device 3a, 5a, a holding device grasping a workpiece is illustrated. However, the holding device is not limited thereto. It is possible to appropriately select a holding device capable of holding and releasing a workpiece such as an electrostatic chuck and vacuum chuck.

In the foregoing, as the stacking direction in the mounting section 4, the vertical direction is illustrated. However, the stacking direction is not limited thereto. The stacking direction in the mounting section 4 may be e.g. the horizontal direction, or a direction inclined with respect to the horizontal direction.

Furthermore, the elements included in the above embodiments can be combined as long as feasible. Such combinations are also encompassed within the scope of the invention as long as they include the features of the invention.

What is claimed is:

1. A processing system comprising:
   a storage section configured to store a workpiece;
   a processing section configured to perform processing on the workpiece;
   a mounting section including a plurality of holding sections with a first spacing in a stacking direction, one of the plurality of holding sections being configured to mount the workpiece;
   a first transport section configured to:
      transport the workpiece between the storage section and the mounting section; and
      enter the mounting section at a first position in the stacking direction; and
   a second transport section having two grasping sections stacked in the stacking direction, the two grasping sections moving vertically in opposite directions, the second transport section being configured to transport the workpiece between the processing section and the mounting section, and the two grasping sections entering the mounting section at a second position different from the first position in the stacking direction, wherein
the first position is provided at two sites in the stacking direction across the second position,
the first transport section and the second transport section are enabled to enter the mounting section around a same time, and
one of the two grasping sections is moved down to mount the workpiece on the holding section, and another one of the two grasping sections is moved up for receiving another workpiece on another holding section.

2. The system according to claim 1, wherein
the mounting section includes a moving section configured to move the mounted workpiece in the stacking direction, and
the moving section moves the mounted workpiece in the stacking direction when the first transport section and the second transport section are retracted from the mounting section.

3. The system according to claim 2, wherein
the second position is set to a predetermined position, and the moving section moves the mounted workpiece depending on the second position.

4. The system according to claim 1, further comprising:
a plurality of processing sections, wherein the first transport section transports one more of workpieces than a number of the plurality of processing sections.

5. The system according to claim 1, wherein
the storage section is configured to store a plurality of workpieces, and
a number of the workpieces transported at a time by the first transport section is a divisor of a maximum number of the workpieces stored in the storage section.

6. The system according to claim 1, wherein
the second transport section includes a first arm and a second arm spaced from the first arm by a second spacing in the stacking direction, and
the first transport section does not pass the workpiece to the holding section located in the second spacing.

7. A processing method comprising:
causing a first transport section to transport a workpiece between a storage section storing the workpiece and a mounting section including a plurality of holding sections with a first spacing in a stacking direction, one of the plurality of the holding sections being configured to mount the workpiece;
causing a second transport section to transport the workpiece between a processing section performing processing on the workpiece and the mounting section; and
performing processing on the workpiece in the processing section, wherein:
the first transport section enters the mounting section at a first position in the stacking direction,
the second transport section includes two grasping sections stacked in the stacking direction, the two grasping sections move vertically in opposite directions, and the two grasping sections enter the mounting section at a second position different from the first position in the stacking direction,
the first position is provided at two sites in the stacking direction across the second position,
the first transport section and the second transport section are enabled to enter the mounting section around a same time, and
one of the two grasping sections is moved down to mount the workpiece on the holding section, and another one of the two grasping sections is moved up for receiving another workpiece on another holding section.

8. A processing system comprising:
a storage section configured to store a workpiece;
a processing section configured to perform processing on the workpiece;
a mounting section including a plurality of holding sections with a first spacing in a stacking direction, one of the plurality of the holding sections being configured to mount the workpiece;
a first transport section configured to:
transport the workpiece between the storage section and the mounting section; and
enter the mounting section at a first position in the stacking direction; and
a second transport section having two grasping sections stacked in the stacking direction, the second transport section being configured to transport the workpiece between the processing section and the mounting section, and the two grasping sections entering the mounting section at a second position different from the first position in the stacking direction, wherein
the first position is provided at two sites in the stacking direction across the second position,
the first transport section and the second transport section are enabled to enter the mounting section around a same time, and
one of the two grasping sections is moved down to mount the workpiece on the holding section, and another one of the two grasping sections is moved up for receiving another workpiece on another holding section.

* * * * *